(12) United States Patent
Zhang

(10) Patent No.: US 9,618,571 B2
(45) Date of Patent: Apr. 11, 2017

(54) DETECTION CIRCUIT FOR RELATIVE ERROR VOLTAGE

(71) Applicant: ZTE CORPORATION, Shenzhen, Guangdong Province (CN)

(72) Inventor: Yongbo Zhang, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 112 days.

(21) Appl. No.: 14/436,605

(22) PCT Filed: Sep. 22, 2013

(86) PCT No.: PCT/CN2013/083896
§ 371 (c)(1),
(2) Date: Apr. 17, 2015

(87) PCT Pub. No.: WO2014/059850
PCT Pub. Date: Apr. 24, 2014

(65) Prior Publication Data
US 2016/0169963 A1 Jun. 16, 2016

(30) Foreign Application Priority Data
Oct. 18, 2012 (CN) ...................... 2012 2 0534856 U

(51) Int. Cl.
*G01R 31/28* (2006.01)
*G01R 19/10* (2006.01)
(52) U.S. Cl.
CPC ......... *G01R 31/2882* (2013.01); *G01R 19/10* (2013.01)
(58) Field of Classification Search
CPC ..... G01R 31/2882; G01R 19/10; G01R 31/28
(Continued)

(56) References Cited

U.S. PATENT DOCUMENTS 5,939,903 A 8/1999 Lin
2005/0140427 A1* 6/2005 Kamijo ............ G01R 19/16519
327/536

FOREIGN PATENT DOCUMENTS

CN 1466764 A 1/2004
CN 1638277 A 7/2005
(Continued)

OTHER PUBLICATIONS

Translation CN101930020.*
Written Opinion of the International Search Authority mailed Dec. 5, 2013 for PCT Application No. PCT/CN2013/083896.

*Primary Examiner* — Melissa Koval
*Assistant Examiner* — Courtney McDonnough
(74) *Attorney, Agent, or Firm* — Plumsea Law Group, LLC

(57) ABSTRACT

A detection circuit for a relative error voltage, including: a first current mirror, a second current mirror, a third current mirror, a current sink and resistors R1, R2 and R3. A voltage signal to be detected V1 accesses the first current mirror via the resistor R2, and a voltage signal to be detected V2 accesses the second current mirror via the resistor R3; a mirrored-end of the first current mirror is connected to the current sink, and a mirroring-end thereof is connected to a mirrored-end of the third current mirror; a mirrored-end of the second current mirror is connected to the current sink, and a mirroring-end thereof is connected to a mirroring-end of the third current mirror; the current sink is grounded via the resistor R1; and the third current mirror converts double-ended currents of the first and the second current mirrors to single-ended currents to output as voltage signals.

14 Claims, 3 Drawing Sheets

(58) Field of Classification Search
USPC .......................................................... 324/537
See application file for complete search history.

(56) References Cited

FOREIGN PATENT DOCUMENTS

| CN | 101930020 A | * 12/2010 | ............. G01R 19/00 |
| CN | 101930020 A | 12/2010 | |
| CN | 202994881 U | 6/2013 | |

* cited by examiner

DETECTION CIRCUIT FOR RELATIVE ERROR VOLTAGE

CROSS-REFERENCE TO RELATED APPLICATION(S)

This application is the U.S. National Phase application of PCT application number PCT/CN2013/083896 having a PCT filing date of Sep. 22, 2013, which claims priority of Chinese patent application 201220534856.3 filed on Oct. 18, 2012, the disclosures of which are hereby incorporated by reference.

TECHNICAL FIELD

The present document relates to the electronic circuit technology field, and in particular, to a detection circuit for a relative error voltage.

BACKGROUND OF THE RELATED ART

In the process of monitoring the voltage signals, it is usually needed to detect whether the relative voltage difference value between two voltage signals meets a certain requirement, for example, when the input signal A is 100 mV greater than the input signal B, it could allow to output a logic level signal. In order to realize the function, the comparator circuit is required to use; while the traditional comparator structures are mostly the grid-input, which can only realize the equivalence detection, and the detection of the relative difference value must be realized through the method of increasing the detuning or delaying; while the circuit precision increased by that type of structure will be changed along with the change of the device Corner (process deviation), and especially when the required difference value is less than 100 mV, the change of the Corner may be greater than the required difference value, which is difficult to meet the requirement for batch production; in addition the gate-source device bearing the high voltage is required to be used while the input signal is a high voltage field, and that type of device needs the extra process layer which will increase the process cost; while if the process layer is not added, it will limit the range of the input signal. So, the structure of the traditional grid input is limited by the precision, which can only be applied to the scene of which the requirement to the precision is not high, and is limited by the process cost, which can only be applied to the scene that the input signal is the low voltage field.

SUMMARY

The embodiment of the present document provides a detection circuit for a relative error voltage, to solve the above-mentioned problems or at least partly solve the above-mentioned problems.

The embodiment of the present document provides a detection circuit for a relative error voltage, comprising: a first current mirror, a second current mirror, a third current mirror, a current sink and resistors R1, R2 and R3; wherein, a voltage signal to be detected V1 accesses the first current mirror via the resistor R2, and a voltage signal to be detected V2 accesses the second current mirror via the resistor R3;

a mirrored end of the first current mirror is connected to the current sink, and a mirroring end of the first current mirror is connected to a mirrored end of the third current mirror; a mirrored end of the second current mirror is connected to the current sink, and a mirroring end of the second current mirror is connected to a mirroring end of the third current mirror; and the current sink is grounded via the resistor R1; and the third current mirror converts double-ended currents of the first current mirror and the second current mirror to single-ended currents to output as voltage signals.

Alternatively, the current sink limits an influent current as: I1=K*Vref/R1; wherein, K is a proportion coefficient (K is a constant not equal to zero), and Vref is a reference voltage with a zero-temperature coefficient.

Alternatively, when the detection circuit for the relative error voltage is in a balance state, a voltage difference between the voltage signals to be detected is: V1−V2=I1*(R2−R3); if the R2 is equal to the R3, then an output logic level of the detection circuit is reversed when the voltage difference between the V1 and the V2 is not zero; and if the R2 is not equal to the R3, then the output logic level is reversed when the voltage difference between the V1 and the V2 reaches a set value.

Alternatively, resistance types of the resistors R1, R2 and R3 are the same.

Alternatively, the resistors R1, R2 and R3 are variable resistors.

Alternatively, the resistors R1, R2 and R3 are variable resistors adjusted through a logic switch.

Alternatively, both the first current mirror and the second current mirror are constituted of two common-source common-gate P-type field effect transistors, or, both are constituted of two common-emitter common-base PNP-type triodes, and a grid and a drain of a transistor at a mirrored end, or a base and a collector of a triode at a mirrored end, are short-circuited as a diode structure; and the third current mirror is constituted of two common-source common-gate N-type field effect transistors, or, is constituted of two common-emitter common-base NPN-type triodes, and a grid and a drain of a transistor at a mirrored end, or a base and a collector of a triode at a mirrored end, are short-circuited as a diode structure.

Alternatively, the voltage signal to be detected V1 accesses a source or an emitter of the first current mirror through the resistor R2, and the voltage signal to be detected V2 accesses a source or an emitter of the second current mirror through the resistor R3.

Through the detection circuit for the relative error voltage described in the embodiment of the present document, on the premise of not increasing the process cost, it can improve the detection precision of the relative difference value effectively, make the precision not be influenced by the temperature and process change, and expand the voltage range of the input signal.

PREFERRED EMBODIMENTS OF THE INVENTION

The technical solution in the embodiment of the present document is clearly and fully described in detail with reference to the accompanying drawings in the embodiment of the present document hereinafter. Obviously, the described embodiment is only part embodiment of the present document, while not all the embodiments. It should be illustrated that, in the case of not conflicting, the embodiments in the present application and features in these embodiments can be combined randomly with each other.

Figure 1:
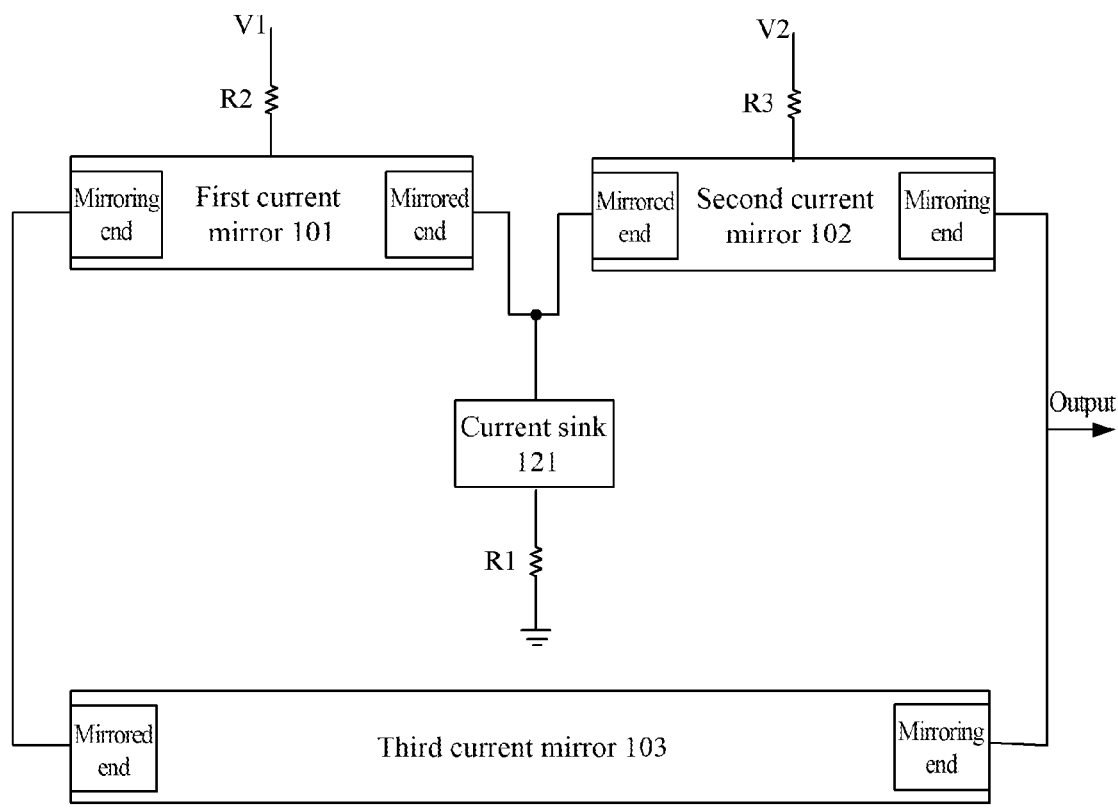
FIG. 1 is a framework diagram of a detection circuit for a relative error voltage provided by an embodiment of the present document.

In order to solve the problem existed in the related art, the embodiment of the present document provides a detection circuit for a relative error voltage, as shown in FIG. 1. The detection circuit for the relative error voltage includes: a first current mirror 101, a second current mirror 102, a third current mirror 103, a current sink 121 and resistors R1, R2 and R3; wherein, a voltage signal to be detected V1 accesses the first current mirror 101 via the resistor R2, and a voltage signal to be detected V2 accesses the second current mirror 102 via the resistor R3;

a mirrored end of the first current mirror 101 is connected to the current sink 121, and a mirroring end of the first current mirror 101 is connected to a mirrored end of the third current mirror 103; a mirrored end of the second current mirror 102 is connected to the current sink 121, and a mirroring end of the second current mirror 102 is connected to a mirroring end of the third current mirror 103; and the current sink 121 is grounded via the resistor R1; and the third current mirror 103 converts double-ended currents of the first current mirror 101 and the second current mirror 102 to single-ended currents, and outputs as voltage signals.

Wherein, the current sink 121 limits an influent current as: I1=K*Vref/R1; wherein, K is a proportion coefficient (K is a constant not equal to zero), and Vref is a reference voltage with a zero-temperature coefficient.

In the embodiment of the present document, when the detection circuit for the relative error voltage is in a balance state, a voltage difference between the voltage signals to be detected is: V1−V2=I1*(R2−R3); if the R2 is equal to the R3, then an output logic level is reversed when a voltage difference between the V1 and the V2 is not zero; and if the R2 is not equal to the R3, then the output logic level is reversed when the voltage difference reaches a set value.

Alternatively, in the embodiment of the present document, resistance types of the resistors R1, R2 and R3 are the same.

Alternatively, in the embodiment of the present document, the resistors R1, R2 and R3 are variable resistors adjusted through a logic switch.

In the embodiment of the present document, the first current mirror 101, the second current mirror 102 and the third current mirror 103 adopt the following structures, wherein, both the first current mirror 101 and the second current mirror 102 are constituted of two common-source common-gate P-type field effect transistors, or, both are constituted of two common-emitter common-base PNP-type triodes, and a grid and a drain of a transistor at a mirrored end, or a base and a collector of a triode at a mirrored end, are short-circuited as a diode structure; and the third current mirror 103 is constituted of two common-source common-gate N-type field effect transistors, or, is constituted of two common-emitter common-base NPN-type triodes, and a grid and a drain of a transistor at a mirrored end, or a base and a collector of a triode at a mirrored end, are short-circuited as a diode structure.

Certainly, the above-mentioned current mirror structure is just one implementation mode to realize the circuit structure described in the embodiment of the present document, but not the unique implementation mode. Based on the technical scheme of the embodiment of the present document, all structure modes which can realize the current mirror obtained by those skilled in the art without paying out the creative work should be embodied in the protection scope of the present document.

In order to clearly explain the realization process of the embodiment of the present document, the detection circuit for the relative error voltage described in the embodiment of the present document is explained in detail through an example hereinafter. In that example, it is supposed that the structure adopted by the first current mirror, the second current mirror and the third current mirror is as described in the above-mentioned embodiment, which involves the following contents.

Figure 2:
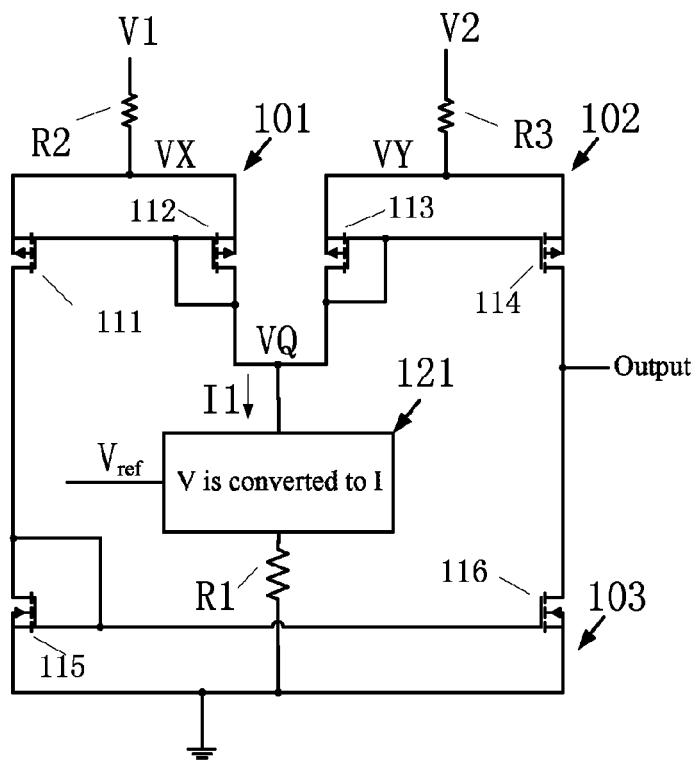
FIG. 2 is a structure diagram of a detection circuit for a relative error voltage provided by an embodiment of the present document.

A structure diagram of the detection circuit for the relative error voltage described by the embodiment of the present document is shown in FIG. 2. In the circuit shown in FIG. 2, the devices 111 and 112 are the P-type Metal Oxide Semiconductor (MOS) transistors, both of them make up the structure of the first current mirror 101 in parallel, and the first input signal V1 links with the source end of the first current mirror 101 through the resistor R2. The devices 113 and 114 are the P-type MOS transistors, both of them make up the structure of the second current mirror 102 in parallel, and the second input signal V2 links with the source end of the second current mirror 102 through the resistor R3. Wherein, the device 111 mirrors the current of the device 112, and the device 114 mirrors the current of the device 113. The devices 115 and 116 are the N-type MOS transistors, both of them make up the structure of the third current mirror 103 in parallel, which are used for converting the mirror currents of the devices 111 and 114 from double-ended to single-ended and outputting in the voltage form. Both the devices 112 and 113 are connected into dipole structures and short-circuited to the first input of the current sink 121; the current sink 121 converts the voltage of the second input Vref into the current related to the resistor R1 connected to the third input, I1=K*Vref/R1, and is drawn by the first input. Wherein, K is a proportion coefficient inside the current sink 121 and can take any value greater than zero, and Vref is the reference voltage of the zero-temperature coefficient.

Figure 3:
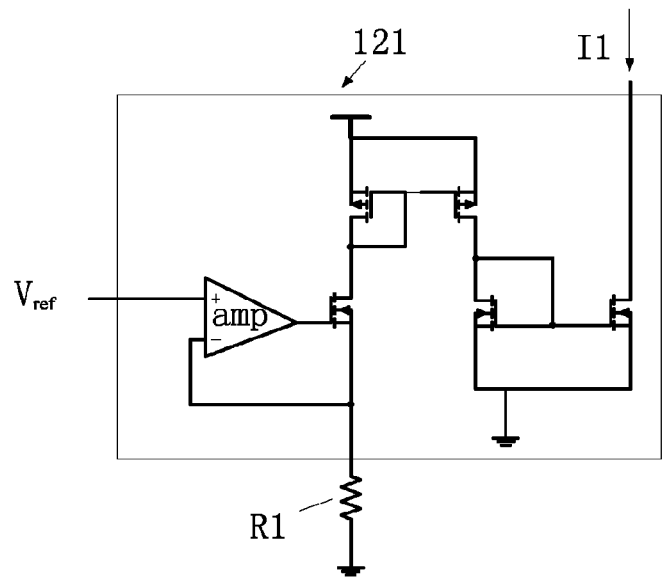
FIG. 3 is a structure diagram of a current sink in an embodiment of the present document.

As shown in FIG. 3, FIG. 3 is a diagram of an implementation structure of the current sink 121, and the current sink 121 is used for converting the reference voltage Vref into the current related to the resistor R1. It should be illustrated that the structure of the current sink shown in FIG. 3 is only one of the multiple implementation modes. The structures of the current sink which, those skilled in the art can think of, realize converting the reference voltage Vref into the current related to the resistor R1 are all in the protection scope of the present document.

In the embodiment of the present document, when the circuit is in a balance state, the node VX=VY, and at this moment, the currents flowing through the devices 111, 112, 113 and 114 are equal, which all equal to half of I1, that is, I111=I112=I113=I114=I1/2; in the present embodiment, making the proportion coefficient K=1, then,

V1=I1*R2+VX; V2=I1*R3+VY;

I1=K*Vref/R1 is brought into the above formula to obtain: V1−V2=V ref*(R2/R1−R3/R1).

It can be seen from the above formula that, when R2=R3, the function of the circuit described in the embodiment of the present document is equivalent to a traditional comparator; at this moment, when the voltage difference between the input detection voltages V1 and V2 is not zero, the output logic level is reversed. When the R2 is not equal to the R3, the function of the circuit described in the embodiment of the present document is a relative difference comparator or a comparator with the hysteresis function, that is, after the difference between the two inputs reaches a certain value (for example, 100 mV), the output logic level is reversed. The precision of the difference is influenced by the proportion of the Vref and the resistor. However, because the Vref is the high-accuracy reference voltage with the zero-temperature coefficient within the current sink chip and it can be relatively easy to control the ratio precision of the two resistors technically, the circuit of the embodiment of the present document can realize the detection function of the high-accuracy relative voltage difference, and the precision is not influenced by the temperature. In order to control the proportion precision of the resistor, alternatively, the resistors R1, R2 and R3 are made to adopt the resistors of the same type; in addition, the influence of the temperature change of the resistor and the Corner can be eliminated by adopting the overall arrangement with the equal proportion, of which the direction and surrounding environment are all matched during the layout arrangement.

In addition, in the circuit described in the embodiment of the present invention, because dividing voltage of the resistors (for example, the R2 and the R3) and the diode connection structure of the devices 111, 113 and 115 make both the grid and source voltages of the Metal-Oxide-Semiconductor Field Effect Transistor (MOSFET) device in the circuit be smaller than 5V, it can avoid using the gird and source devices bearing the high voltage, and expands the voltage range of the input signal effectively.

In the circuit of the present invention, because of the particularity of the input structure, it is made to have the characteristic of the input bearing the high voltage, and all devices are selected to use the device of which the drain and source voltages VDS or the voltage VCE between the collector and emitter bear the high voltage, that is, the circuit can be applied to the scene of detecting the high voltage input signal.

Figure 4:
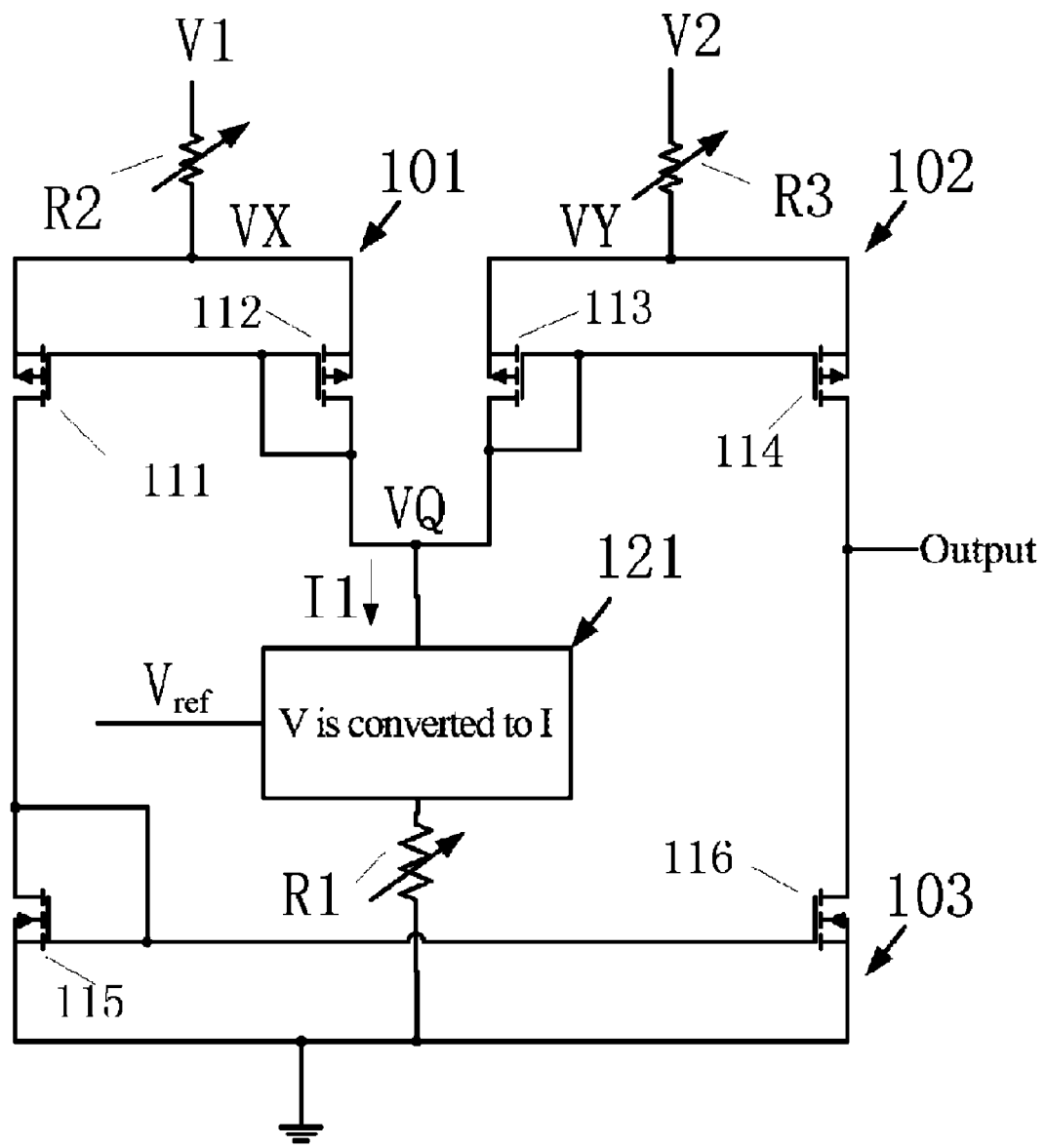
FIG. 4 is a structure diagram of another detection circuit for a relative error voltage provided by an embodiment of the present document.

In the embodiment of the present document, the resistors R1, R2 and R3 can be set as the variable resistors of which the resistor values can be adjusted through the logic switch, to realize configuring the ratios of R2/R1 and R3/R1 by adjusting the resistance value of the resistors R1, R2 and R3, which can realize the function of adjusting the difference size in real time and can satisfy the application that the system requires various difference values in different scenes. Alternatively, the structure of another detection circuit for the relative error voltage provided in the embodiment of the present document is shown in FIG. 4.

In sum, through the detection circuit for the relative error voltage described in the embodiment of the present document, on the premise of not increasing the process cost, it can improve the detection precision of the relative difference value effectively, makes the precision not be influenced by the temperature and process change, and expands the voltage range of the input signal.

Obviously, those skilled in the art can perform various changes and modifications to the present document without departing from the spirit and the range of the present document. In this way, if these changes and modifications of the present document are within the range of the claims of the present document and their technologies, then the present document intends to include these changes and modifications as well.

INDUSTRIAL APPLICABILITY

Through the detection circuit for the relative error voltage of the embodiment of the present document, it can improve the detection precision of the relative difference value effectively, make the precision not be influenced by the temperature and process change, and expand the voltage range of the input signal.

What I claim is:

1. A detection circuit for a relative error voltage, comprising: a first current mirror, a second current mirror, a third current mirror, a current sink and resistors R1, R2 and R3; wherein,
   a voltage signal to be detected V1 accesses the first current mirror via the resistor R2, and a voltage signal to be detected V2 accesses the second current mirror via the resistor R3;
   a mirrored end of the first current mirror is connected to the current sink, and a mirroring end of the first current mirror is connected to a mirrored end of the third current mirror; a mirrored end of the second current mirror is connected to the current sink, and a mirroring end of the second current mirror is connected to a mirroring end of the third current mirror; and
   the current sink is grounded via the resistor R1; and the third current mirror converts double-ended currents of the first current mirror and the second current mirror to single-ended currents to output as voltage signals.

2. The detection circuit for a relative error voltage according to claim 1, wherein, the current sink limits an influent current as: I1 =K*Vref/R1;
   wherein, K is a proportion coefficient (K is a constant not equal to zero), and Vref is a reference voltage with a zero-temperature coefficient.

3. The detection circuit for a relative error voltage according to claim 2, wherein,
   when the detection circuit for the relative error voltage is in a balance state, a voltage difference between the voltage signals to be detected is: V1−V2=I1*(R2−R3); if the R2 is equal to the R3, then an output logic level is reversed when the voltage difference between the V1 and the V2 is not zero; and if the R2 is not equal to the R3, then the output logic level is reversed when the voltage difference between the V1 and the V2 reaches a set value.

4. The detection circuit for a relative error voltage according to claim 1, wherein, resistance types of the resistors R1, R2 and R3 are the same.

5. The detection circuit for a relative error voltage according to claim 1, wherein, the resistors R1, R2 and R3 are variable resistors.

6. The detection circuit for a relative error voltage according to claim 5, wherein, the resistors R1, R2 and R3 are variable resistors adjusted through a logic switch.

7. The detection circuit for a relative error voltage according to claim 1, wherein,
   both the first current mirror and the second current mirror are constituted of two common-source common-gate P-type field effect transistors, or, both the first current mirror and the second current mirror are constituted of two common-emitter common-base PNP-type triodes, and a grid and a drain of a transistor at a mirrored end, or a base and a collector of a triode at a mirrored end, are short-circuited as a diode structure; and the third current mirror is constituted of two common-source common-gate N-type field effect transistors, or, is constituted of two common-emitter common-base NPN-type triodes, and a grid and a drain of a transistor at a mirrored end, or a base and a collector of a triode at a mirrored end, are short-circuited as a diode structure.

8. The detection circuit for a relative error voltage according to claim 7, wherein, the voltage signal to be detected V1 accesses a source or an emitter of the first current mirror through the resistor R2, and the voltage signal to be detected V2 accesses a source or an emitter of the second current mirror through the resistor R3.

9. The detection circuit for a relative error voltage according to claim 2, wherein, the resistors R1, R2 and R3 are variable resistors.

10. The detection circuit for a relative error voltage according to claim 3, wherein, the resistors R1, R2 and R3 are variable resistors.

11. The detection circuit for a relative error voltage according to claim 4, wherein, the resistors R1, R2 and R3 are variable resistors.

12. The detection circuit for a relative error voltage according to claim 9, wherein, the resistors R1, R2 and R3 are variable resistors adjusted through a logic switch.

13. The detection circuit for a relative error voltage according to claim 10, wherein, the resistors R1, R2 and R3 are variable resistors adjusted through a logic switch.

14. The detection circuit for a relative error voltage according to claim 11, wherein, the resistors R1, R2 and R3 are variable resistors adjusted through a logic switch.

* * * * *